United States Patent
Shimizu et al.

(10) Patent No.: US 9,622,352 B2
(45) Date of Patent: Apr. 11, 2017

(54) MANUFACTURING METHOD FOR COMPONENT INCORPORATED SUBSTRATE AND COMPONENT INCORPORATED SUBSTRATE

(71) Applicant: MEIKO ELECTRONICS CO., LTD., Ayase-shi, Kanagawa (JP)

(72) Inventors: Ryoichi Shimizu, Ayase (JP); Mitsuo Iwamoto, Ayase (JP); Mitsuaki Toda, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 147 days.

(21) Appl. No.: 14/429,741

(22) PCT Filed: Sep. 26, 2012

(86) PCT No.: PCT/JP2012/074711
§ 371 (c)(1),
(2) Date: Mar. 19, 2015

(87) PCT Pub. No.: WO2014/049721
PCT Pub. Date: Apr. 3, 2014

(65) Prior Publication Data
US 2015/0237734 A1    Aug. 20, 2015

(51) Int. Cl.
*H05K 3/30*    (2006.01)
*H05K 1/18*    (2006.01)
(Continued)

(52) U.S. Cl.
CPC .......... *H05K 1/188* (2013.01); *H05K 1/0269* (2013.01); *H05K 1/0284* (2013.01); *H05K 1/09* (2013.01);
(Continued)

(58) Field of Classification Search
CPC ........ H05K 1/188; H05K 3/305; H05K 1/115; H05K 1/0284; H05K 1/09; H05K 1/0269;
(Continued)

(56) References Cited

U.S. PATENT DOCUMENTS

| | | | | |
|---|---|---|---|---|
| 5,956,564 | A | * | 9/1999 | Newman ................. G03F 9/708 29/603.1 |
| 7,178,229 | B2 | * | 2/2007 | Borland ............... H05K 1/0269 29/847 |

(Continued)

FOREIGN PATENT DOCUMENTS

| JP | H09 5022 A | 1/1997 |
|---|---|---|
| JP | 2002-176298 A | 6/2002 |

(Continued)

OTHER PUBLICATIONS

Extended European Search Report for European Patent Application No. 12885910.5, dated Jun. 27, 2016.
(Continued)

*Primary Examiner* — Donghai D Nguyen
(74) *Attorney, Agent, or Firm* — Marshall, Gerstein & Borun LLP

(57) ABSTRACT

In a mark forming step in a manufacturing method for a component incorporated substrate in which an electronic component is positioned with reference to a mark formed in a copper layer, when an imaginary line extending from a search center of a search range of a sensor, to an edge side of the search range is represented as a search reference line and an imaginary line extending, in a state in which a mark center, is matched with the search center, from the mark center in the same direction as the search reference line to an outer ridgeline of the mark is represented as a mark reference line, the mark formed in a shape in which the outer ridgeline of the mark is present in a position where a length
(Continued)

of the mark reference line is in a range of 30% or more of the search reference line.

4 Claims, 13 Drawing Sheets

(51) Int. Cl.
*H05K 1/11* (2006.01)
*H05K 1/02* (2006.01)
*H05K 1/09* (2006.01)

(52) U.S. Cl.
CPC ............. *H05K 1/115* (2013.01); *H05K 3/305* (2013.01); *H05K 2201/0335* (2013.01); *H05K 2201/09918* (2013.01); *Y10T 29/49131* (2015.01)

(58) Field of Classification Search
CPC .. H05K 2201/0335; H05K 2201/09918; G03F 9/709; Y10T 29/49131; Y10T 29/49155; Y10T 29/49156; Y10T 29/49165
USPC ................. 29/830, 832, 833, 846, 847, 852; 174/259, 260, 262; 361/761, 767; 438/975
See application file for complete search history.

(56) References Cited

U.S. PATENT DOCUMENTS

| | | | | |
|---|---|---|---|---|
| 7,719,851 | B2* | 5/2010 | Tuominen | H01L 23/5389 29/842 |
| 8,225,503 | B2* | 7/2012 | Kariya | H01L 21/568 29/846 |
| 8,921,706 | B2* | 12/2014 | Toda | H05K 1/188 174/260 |
| 2009/0205202 | A1 | 8/2009 | Tanaka et al. | |
| 2013/0242516 | A1 | 9/2013 | Imamura et al. | |

FOREIGN PATENT DOCUMENTS

| | | |
|---|---|---|
| JP | 2005-159345 A | 6/2005 |
| JP | 2007-258374 A | 10/2007 |
| JP | 2007-535156 A | 11/2007 |
| JP | 2010-027917 A | 2/2010 |
| JP | 2012-507154 A | 3/2012 |
| TW | 201218897 A | 5/2012 |
| WO | WO-2009/101723 A1 | 8/2009 |

OTHER PUBLICATIONS

Search Report for PCT/JP2012/074711, dated Dec. 18, 2012.
Written Opinion for PCT/JP2014/074711, dated Dec. 18, 2012.

* cited by examiner

MANUFACTURING METHOD FOR COMPONENT INCORPORATED SUBSTRATE AND COMPONENT INCORPORATED SUBSTRATE

TECHNICAL FIELD

The present invention relates to manufacturing method for a component incorporated substrate in which electric or electronic components are embedded in a substrate and a component incorporated substrate manufactured using the method.

BACKGROUND ART

In recent years, according to an increase in density and improvement of functions of electronic circuit substrate, a component incorporated substrate having structure in which electronic components are embedded in an insulating substrate which is an insulating layer has been attracting attention (see, for example, Patent Document 1). In such a component incorporated substrate, a wiring pattern is formed on the surface of the insulating substrate. The component incorporated substrate can be used as a module with other various electronic components surface-mounted in predetermined positions of the wiring pattern. The component incorporated substrate can also be used as a core substrate in manufacturing a component incorporated multilayer circuit substrate with a build-up method.

In such a component incorporated substrate, it is necessary to provide a connecting section that electrically connects the wiring pattern on the surface of the insulating substrate and a terminal of an electronic component in the insulating substrate. As a conventional manufacturing method for a component incorporated substrate, first, a copper layer, which should be a wiring pattern, is formed on a supporting plate. A connecting section is formed in a predetermined position on the copper layer by solder paste. The electronic component is disposed such that the terminal is positioned on the connecting section. Subsequently, the connecting section and the electronic component are embedded by an insulating material, which becomes the insulating substrate. An intermediate product incorporating the electronic component is obtained. Thereafter, the supporting plate is peeled off the intermediate product. The exposed copper layer is formed into a wiring pattern having a predetermined shape, whereby a component incorporated substrate is obtained.

Incidentally, when the other various electronic components are surface-mounted on the surface of the component incorporated substrate, reflow soldering is performed. Therefore, the component incorporated substrate is exposed to high temperature equal to or higher than a melting temperature of solder every time the reflow soldering is performed. Therefore, it is likely that reliability of the connecting section between the wiring pattern and the terminal section of the electronic component is deteriorated.

Therefore, in the component incorporated substrate, in order to attain improvement of thermal reliability of the connecting section between the wiring pattern and the terminal section of the electronic component, it is conceivable to use, as a material forming such a connecting section, copper that has a high melting point compared with the solder and is less easily affected by heat in the reflow soldering. The connecting section formed using the copper is formed by, for example, after embedding the electronic component in the insulating substrate, providing a connection hole that extends from the wiring pattern on the substrate surface to the terminal of the electronic component in the substrate and filling the copper in the connection hole using a plating method. In this case, since the connection hole has to be accurately formed toward the terminal of the electronic component in the insulating substrate, in a manufacturing process, it is necessary to improve accuracy of positioning of the electronic component and accuracy of specifying of a terminal position. A form of a manufacturing method for a component incorporated substrate that attains improvement of these kinds of accuracy is explained below.

First, a supporting plate is prepared and a copper layer is formed on the supporting plate. A mark consisting of a columnar body of copper is formed on the copper layer by the plating method. Subsequently, after the mark is detected by a sensor of an optical system, an electronic component is positioned in a predetermined position on the copper layer with reference to the position of the detected mark and fixed by an insulative adhesive. Thereafter, the fixed electronic component and the mark are covered with an insulating material to form an insulating layer as an insulating substrate embedded with the electronic component. Thereafter, the supporting plate is peeled to expose the copper layer. In the exposed copper layer, a portion where the mark is present is etched and removed, whereby the mark is exposed. A terminal position of the electronic component is specified with reference to the exposed mark. A connection hole reaching the terminal is formed. Thereafter, copper plating is applied to the entire copper layer including the formed connection hole to fill the connection hole with the copper, whereby the copper layer and the terminal are electrically connected. Finally, the copper layer on the surface of the insulating substrate is processed into a predetermined wiring pattern, whereby a component incorporated substrate is manufactured.

With the manufacturing method, since the same mark is used as a reference for the positioning of the electronic component and the specifying of the terminal position, it is possible to accurately perform the positioning of the electronic component and the specifying of the position of the terminal.

PRIOR ART DOCUMENT

Patent Document

Patent Document 1: Japanese Patent Application Laid-Open No. 2010-027917

SUMMARY OF THE INVENTION

Problems to be Solved by the Invention

Incidentally, in the manufacturing method explained above, there is a problem in that, when the electronic component is positioned with reference to the mark, detection accuracy of the mark is deteriorated because of a detection error of the mark and positioning accuracy of the component is also deteriorated according to the deterioration in the detection accuracy of the mark. If the component cannot be accurately positioned in the predetermined position, accuracy of specifying a terminal position in a later process is also affected. In future, since the electronic component will be further reduced in size and higher positioning accuracy will be requested, further improvement of the detection accuracy of the mark is demanded.

The present invention has been devised in view of the above circumstances and it is an object of the present invention to provide a manufacturing method for a component incorporated substrate that can improve detection accuracy of a mark and therefore can accurately perform positioning of a component and specifying of the position of the component and a component incorporated substrate manufactured using the method.

Means for Solving the Problems

In order to attain such an object, according to the present invention, there is provided a manufacturing method for a component incorporated substrate in which, in an insulating substrate including a wiring pattern on the surface, an electric or electronic component including a terminal electrically connected to the wiring pattern is incorporated, the manufacturing method including: a mark forming step for forming a copper layer, which should be the wiring pattern, on a supporting plate and forming a mark formed by a plating method on a second surface on the opposite side of a first surface in contact with the supporting plate of the copper layer, the mark having a proximal end face in contact with the second surface, a side surface extending from the outer circumferential edge of the proximal end face in a direction orthogonal to the second surface, an outer circumferential curved surface tapering and extending in an arcuate shape from the proximal end edge of the side surface, and a top surface extending from the distal end edge of the outer circumferential curved surface and opposed to the proximal end face; a component mounting step for, after detecting the mark using detecting means for detecting the detection target in a square search range set in an image pickup screen that reflects a picked-up image of a detection target, positioning the component with reference to the detected mark and mounting the component on the second surface of the copper layer with an insulative adhesive layer interposed therebetween; an embedding layer forming step for forming, on the second surface of the copper layer on which the component is mounted, an embedding layer functioning as the insulating substrate in which the component and the mark are embedded; a window forming step for, after peeling the supporting plate off the copper layer, etching and removing, with a copper etching agent used for etching of copper, a part of the copper layer from the first surface side of the copper layer exposed by the peeling and forming a window for partially exposing the embedding layer together with the entire proximal end face of the mark; a conduction via forming step for specifying the position of a terminal of the component with reference to the mark exposed from the window and, after forming a via hole reaching the terminal, filling a conductive material in the via hole and forming a conduction via for electrically connecting the terminal and the copper layer; and a pattern forming step for forming the copper layer electrically connected to the terminal via the conduction via into the wiring pattern. In the mark forming step, when an imaginary line extending from a search center, which is the center of the search range, to the edge side of the search range is represented as a search reference line and an imaginary line extending, in a state in which the center of the mark is matched with the search center, from the center of the mark in the same direction as the search reference line and to an outer ridgeline, which is the boundary between the top surface and the outer circumferential curved surface in the mark, is represented as a mark reference line, the mark is formed in a shape in which the outer ridgeline of the mark is present in a position where a length of the mark reference line is in a range of 30% or more of the search reference line.

It is preferable to adopt a form in which the mark is formed in a circular shape in plan view.

It is preferable to adopt a form in which the mark is formed in a square shape in plan view.

It is preferable to adopt a form in which the mark is formed in a ring shape in plan view.

According to the present invention, there is provided a component incorporated substrate manufactured using the manufacturing method for the component incorporated substrate, the component incorporated substrate including a mark having a proximal end face in contact with a second surface of the copper layer, a side surface extending from the outer circumferential edge of the proximal end face in a direction orthogonal to the second surface, an outer circumferential curved surface tapering and extending in an arcuate shape from the proximal end edge of the side surface, and a top surface extending from the distal end edge of the outer circumferential curved surface and opposed to the proximal end face.

Advantageous Effects of the Invention

In the manufacturing method for the component incorporated substrate according to the present invention, in the mark forming step, when an imaginary line extending from a search center, which is the center of the search range of the detecting means, to the edge side of the search range is represented as a search reference line and an imaginary line extending, in a state in which the center of the mark is matched with the search center, from the center of the mark in the same direction as the search reference line and to an outer ridgeline, which is the boundary between the top surface and the outer circumferential curved surface in the mark, is represented as a mark reference line, the mark is formed in a shape in which the outer ridgeline of the mark is present in a position where the length of the mark reference line is in a range of 30% or more of the search reference line. Therefore, effects described below are attained. That is, since a ratio of the mark in the search range increases, it is possible to accurately perform specifying of the contour of the mark. Consequently, it is possible to improve detection accuracy of the mark and accurately perform positioning of the component and specifying of the position of the component.

Since the component incorporated substrate of the present invention is obtained by the manufacturing method explained above, detection accuracy of the mark is high, the terminal of the incorporated component and the wiring pattern are highly accurately positioned, failures of electrical connection are extremely few, and the component incorporated substrate is excellent in quality.

DETAILED DESCRIPTION OF THE INVENTION

First Embodiment

In the present invention, first, a mark for positioning consisting of a columnar body made of copper is formed on a starting material (a mark forming step). The starting material is prepared, for example, as explained below.

Figure 1:
FIG. 1 is a sectional view schematically showing a supporting plate (a thin plate made of stainless steel) used in a manufacturing method for a component incorporated substrate according to an embodiment of the present invention.
Figure 2:
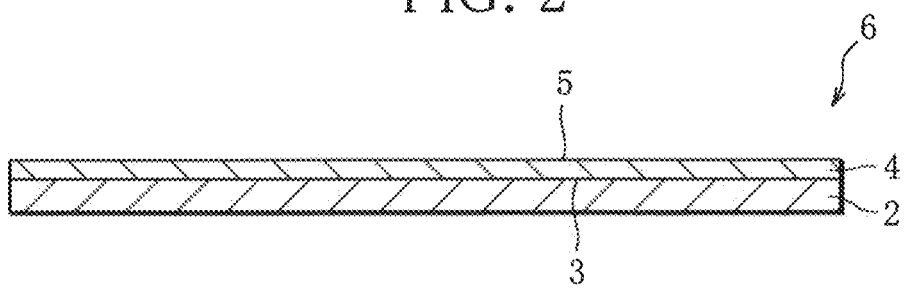
FIG. 2 is a sectional view schematically showing a copper-plated steel plate obtained by forming a copper layer on the supporting plate shown in FIG. 1.

First, as shown in FIG. 1, a supporting plate 2 is prepared. The supporting plate 2 is, for example, a thin plate made of stainless steel. As shown in FIG. 2, a first copper layer 4 consisting of a thin film is formed on the supporting plate 2. The first copper layer 4 consists of, for example, a copper plating film obtained by electroplating. A copper-plated steel plate 6 obtained in this way is used as a starting material. In the first copper layer 4, a surface in contact with the supporting plate 2 is represented as a first surface 3. A surface on the opposite side of the first surface 3 is represented as a second surface 5.

Note that, as the supporting plate 2, a thin plate made of aluminum can be used. In this case, the first copper layer 4 consists of, for example, a copper foil and is stuck to the surface of a thin plate made of aluminum.

Figure 3:
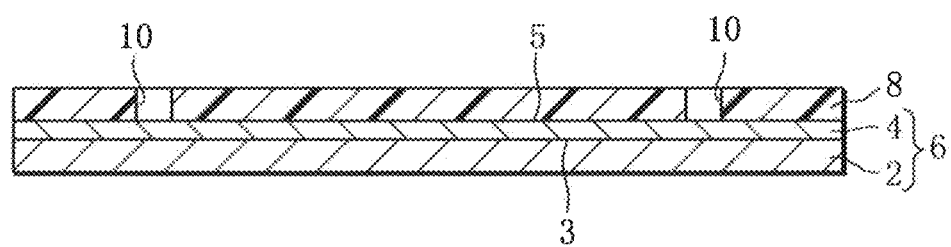
FIG. 3 is a sectional view schematically showing a state in which a plating resist film for pattern plating is formed on the copper layer of the copper-plated steel plate shown in FIG. 2.

Subsequently, as shown in FIG. 3, a mask layer 8 is formed on the first copper layer 4 of the prepared copper-plated steel plate 6. The mask layer 8 is, for example, a plating resist consisting of a dry film having predetermined thickness. Openings 10 are provided in predetermined positions of the mask layer 8. The openings 10 consist of through-holes, a plan view shape of which is circular. The copper layer 4 is exposed in the bottoms of the openings 10. By applying electroplating of copper to the copper-plated steel plate 6 including such a mask layer 8, the copper is preferentially deposited in the exposed portion. Marks 12 for positioning consisting of columnar copper posts extending along the shape of the insides of the openings 10 are formed. Thereafter, when the dry film 8 is removed, the marks 12 for positioning consisting of the copper post appear in predetermined positions on the second surface 5 of the first copper layer 4 (see FIG. 4).

Figure 5:
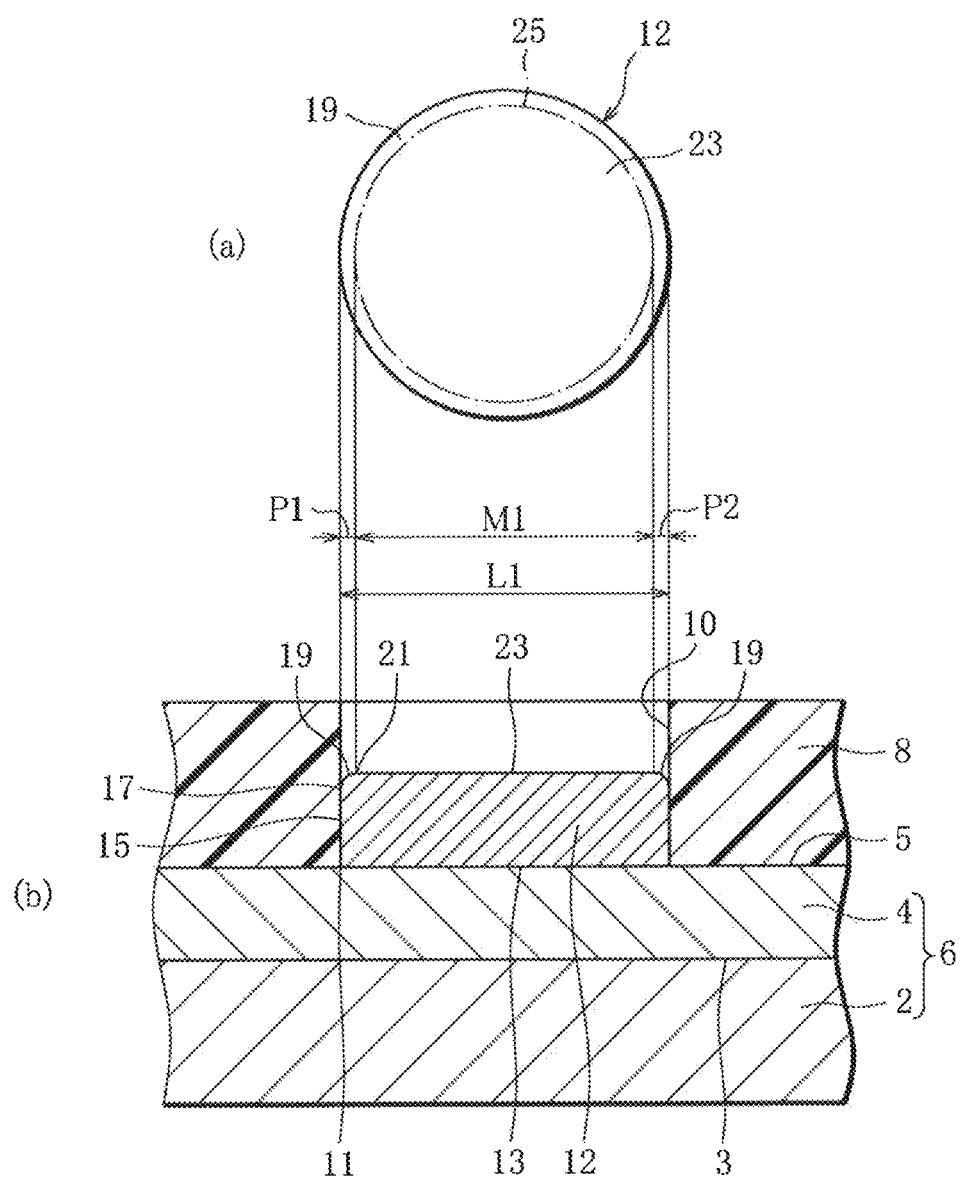
FIG. 5 is a plan view (a) showing the mark and a sectional view (b) showing the mark.

The shape of the marks 12 is explained in detail. First, as shown in FIG. 5(a) showing a plan view shape of the mark 12 and FIG. 5(b) showing a sectional shape of the mark 12, the mark 12 is formed in a flat columnar shape. Specifically, the mark 12 includes a proximal end face 13 in contact with the second surface 5 of the copper layer 4, a side surface 15 extending from an outer circumference edge 11 of the proximal end face 13 in a direction orthogonal to the second surface 5 of the copper layer 4 (an upward direction in FIG. 5), an outer circumferential curved surface 19 tapering and extending in an arcuate shape from a distal end edge 17 of the side surface 15, and a top surface 23 extending from a distal end edge 21 of the outer circumferential curved surface 19 and opposed to the proximal end face 13. The proximal end face 13 is flat modeled after the second surface 5 of the copper layer 4. The external shape of the proximal end face 13 is formed in a circular shape along the inside shape of the opening 10. The side surface 15 is a circumferential surface modeled after the inner circumferential surface of the opening 10. The outer circumferential curved surface 19 is located between the side surface 15 and the top surface 23 of the mark 12 and formed in an arcuate shape in a growth process of plating. The top surface 23 is positioned in a position opposed to the proximal end face 13 and is formed as a substantially flat surface. The distal end edge 21 of the outer circumferential curved surface 19 is a boundary with the top surface 23. The boundary is referred to as outer ridgeline 25 (see FIG. 5(a)). When the width (the diameter) of the mark 12 is represented as L1, the width (the diameter) of the top surface 23 is represented as M1, and the widths of the outer circumferential curved surface 19 are represented as P1 and P2, L1=M1+P1+P2. Usually, P1 and P2 are the same value. However, a slight difference sometimes occurs. Therefore, for convenience, the width on the left side in FIG. 5 is represented as P1 and the width on the right side in FIG. 5 is represented as P2. Note that the outer circumferential curved surface 19 is drawn exaggeratedly for explanation. The size of the mark 12 is determined as explained below in a relation with the size of a search range of an optical sensor functioning as detecting means used in a component mounting step in a later stage.

Figure 6:
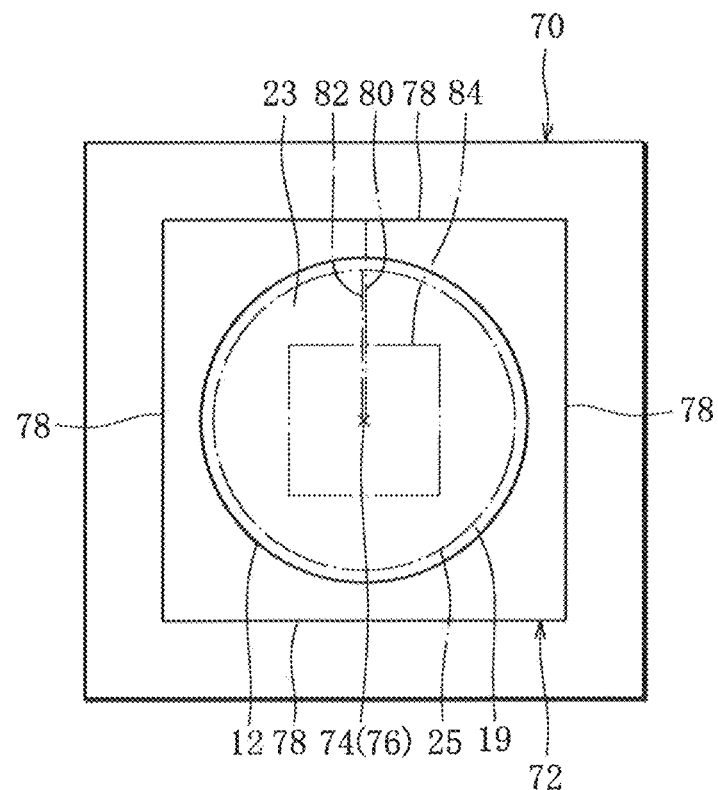
FIG. 6 is a plan view schematically showing a search range.

The optical system sensor picks up an image of the detection target. A square search range is set in an image pickup screen that reflects the image. In the detection of the mark 12, the mark 12 is fit in the search range. Detection light is irradiated in the search range in this state. The detection of the mark 12 is performed by receiving, with a light receiving sensor, reflected light of the detection light irradiated on the top surface 23 of the mark 12, reflected, and returned. Specifically, as shown in FIG. 6, a square search range 72 is set in a predetermined position in an image pickup screen 70 of the optical system sensor. The mark 12 is fit in the search range 72 such that a search center 74, which is the center of the search range 72, and a mark center 76 of the mark 12 match. In this case, a search reference line 80 extending from the search center 74 to an edge side 78 of the search range 72 is assumed. A mark reference line 82 extending from the mark center 76 in the same direction as the search reference line 80 and to the outer ridgeline 25 of the mark 12 is assumed. The size of the mark 12 is set to satisfy a relation in which the length of the mark reference line 82 is equal to or larger than 30% of the entire length of the search reference line 80. Specifically, the size of the mark 12 is set as explained below. First, when the search reference line 80 is moved around the search center 74 centering on the search center 74, an imaginary square 84 in FIG. 6 is obtained by a track of a portion of 30% of the entire length of the search reference line 80. The imaginary square 84 is hereinafter referred to as lower limit region 84. On the other hand, when the mark reference line 82 is moved around the mark center 76 centering on the mark center 76, a track of the distal end of the mark reference line 82 is the outer ridgeline 25. The mark 12 is formed in a shape in which the outer ridgeline 25 is located further on the outer side than the lower limit region 84. Consequently, it is possible to obtain the mark 12 having the size that satisfies the relation.

The optical system sensor usually receives the detection light reflected from the mark 12 and detects the mark 12. Specifically, the mark 12 is detected as explained below. First, the detection light is irradiated on the top surface 23 and the outer circumferential curved surface 19 of the mark 12 and a portion deviating from the mark 12. The detection light irradiated on the top surface 23 directly returns to the light reception sensor. Therefore, a level of light reception intensity is high. On the other hand, the detection light irradiated on the outer circumferential curved surface 19 scatters. Therefore, light directly returning to the light reception sensor is little compared with the top surface 23. Reflected light does not return from the portion deviating from the mark 12. A light reception intensity level of the light reception sensor is extremely low. The outer ridgeline 25 is read from a difference between the levels of the light reception intensity of the light reception sensor to detect the shape of the mark 12.

The inventor of this application has found that, when the mark 12 is set smaller than the lower limit region 84, the curvature radius of the outer circumferential curved surface 19 is larger and the widths P1 and P2 of the outer circumferential curved surface 19 are larger and, when the mark 12 is set larger than the lower limit region 84, the curvature radius of the outer circumferential curved surface 19 is smaller and the widths P1 and P2 of the outer circumferential curved surface 19 are smaller. When the widths P1 and P2 of the outer circumferential curved surface 19 are large, a reading error of the outer ridgeline 25 increases and affects the detection of the mark 12. In the present invention, under the knowledge explained above, in order to set the mark 12 larger than the lower limit region 84, the length of the mark reference line 82 is specified to be equal to or larger than 30% of the length of the search reference line 80.

In this way, when a relation in which the length of the mark reference line 82 is specified to be equal to or larger than 30% of the length of the search reference line 80 is satisfied, the mark 12 is relatively large and the curvature radius of the outer circumferential curved surface 19 is small. Therefore, it is possible to reduce a reading error of the outer ridgeline 25. When a degree of a measurement error of a measuring device is the same, the influence of the error on accuracy in specifying the outer shape of the mark is lower as the size of the mark is larger. As a result, detection accuracy of the mark is considered to be higher.

In this embodiment, the optical system sensor, the length of one side of the search range 78 of which is 5 mm, is used. Specific dimensions of the sections in this embodiment are described below. Concerning the mark 12, L1 is 2.540 mm, M1 is 2.476 mm, P1 is 0.035 mm, and P2 is 0.029 mm.

Note that a method of forming the mark 12 consisting of the copper plated layer is not limited to the electroplating method. An electroless plating method can also be adopted. The electroplating method and the electroless plating method can also be concurrently used.

Figure 4:
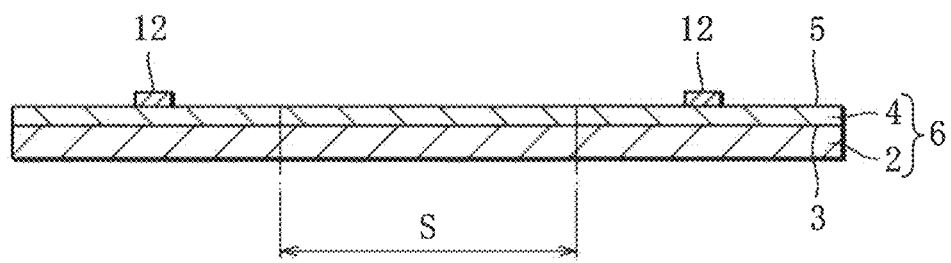
FIG. 4 is a sectional view schematically showing a state in which marks are formed on the copper layer of the copper-plated steel plate shown in FIG. 2.

The setting position of the mark 12 can be arbitrarily selected. However, it is preferable to provide the mark 12 in a position where an optical system sensor of an optical system positioning device (not shown in the figure), which performs positioning of an electronic component (hereinafter referred to as intra-substrate component) 14 that should be incorporated in the insulating substrate, can easily recognize the mark 12. In this embodiment, as shown in FIG. 4, two marks 12 are formed across a mounting planned region S where the intra-substrate component 14 is planned to be mounted.

It is preferable to apply conventionally publicly-known surface roughening treatment to the second surface 5 of the first copper layer 4 using a sulfuric acid-hydrogen peroxide-based copper etching agent among copper etching agents used for etching of copper. In this case, a masking tape is stuck to the marks 12. Such a masking tape is removed after the surface roughening treatment. Consequently, the marks 12 are not eroded. It is possible to maintain a glossy surface. As a result, a contrast between the marks having glossiness and the roughened first copper layer 4 around the marks is made clear. This contributes to a reduction in a detection error of the optical sensor. Since the first copper layer 4 is roughened, in an embedding layer forming step, which is a later step, an anchor effect is exhibited between the insulating substrate and the first copper layer 4 and improvement of adhesion can be attained.

Subsequently, the intra-substrate component 14 is mounted on the copper-plated steel plate 6 via an adhesive 16 (a component mounting step).

Figure 7:
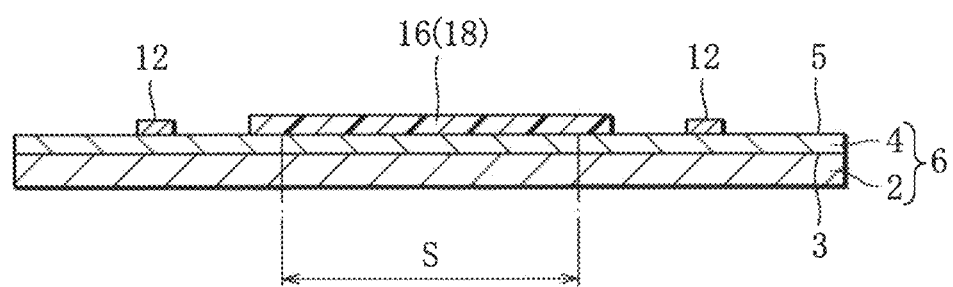
FIG. 7 is a sectional view schematically showing a state in which an adhesive is supplied onto the copper layer of the copper-plated steel plate shown in FIG. 4.

First, as shown in FIG. 7, the adhesive 16 is supplied to the mounting planned region S on the copper layer 4. The adhesive 16 only has to cover at least the entire mounting planned region S. Positioning accuracy of the adhesive 16 may be relatively low. When positioning of the adhesive 16 is performed, the mounting planned region S is specified with reference to the marks 12. The adhesive 16 is applied to a specified position. This is preferable because the positioning accuracy of the adhesive 16 is improved. Note that, if the adhesive 16 is appropriately disposed in a predetermined position corresponding to a position where a terminal of the intra-substrate component 14 is present, a form in which the adhesive 16 covers a part of the mounting planned region S may be adopted.

The adhesive 16 hardens and changes to an adhesive layer 18 having predetermined thickness. The adhesive layer 18 to be obtained fixes the intra-substrate component 14 in a predetermined position and has a predetermined insulation property. The adhesive 16 is not particularly limited as long as the adhesive 16 exhibits predetermined bonding strength and a predetermined insulation property after the hardening. However, an adhesive obtained by adding a filler to thermosetting epoxy resin or polyimide resin is used. As the filler, for example, fine powder of silica (silicon dioxide), glass fiber, or the like is used.

In the present invention, a form of the adhesive 16 supplied to the mounting planned region S is not particularly limited. A form may be adopted in which the adhesive 16 in a liquid state is applied at predetermined thickness. A form may be adopted in which the adhesive 16 of a sheet shape having predetermined thickness is placed. In this embodiment, an adhesive in a liquid state obtained by adding fine powder of silica to thermosetting epoxy resin is used.

Figure 8:
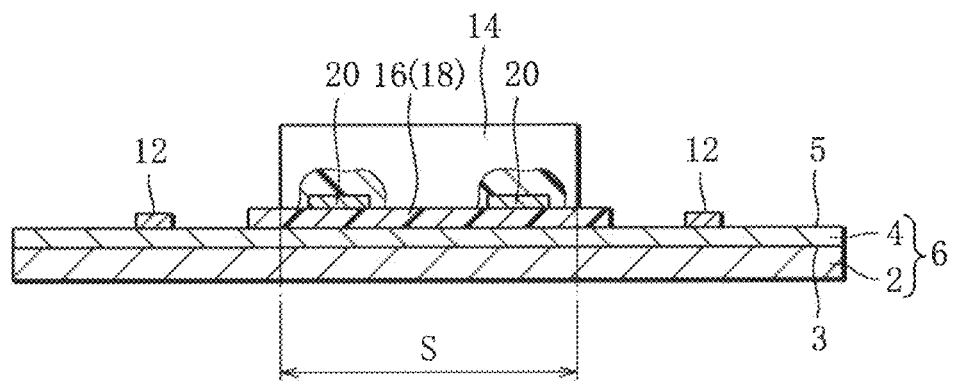
FIG. 8 is a sectional view schematically showing a state in which an electronic component is mounted on the adhesive of the copper-plated steel plate shown in FIG. 7.

Subsequently, as shown in FIG. 8, the adhesive 16 is applied to the mounting planned region S on the second surface 5 of the first copper layer 4. The intra-substrate component 14 is mounted on the adhesive 16. In this case, the intra-substrate component 14 is positioned in the mounting planned region S with reference to the mark 12. Thereafter, the adhesive 16 is heated using a thermosetting furnace or the like to harden and change to the adhesive layer 18. Consequently, the intra-substrate component 14 is fixed in the predetermined position.

Specifically, as it is evident from FIG. 8, the intra-substrate component 14 is a rectangular parallelepiped package component in which an IC chip or the like (not shown in the figure) is covered with resin. A plurality of terminals 20 are provided in a lower part of the package component. The adhesive layer 18 is interposed between the second surface 5 of the copper layer 4 and each of the intra-substrate component 14 and the terminals 20.

Subsequently, an insulating base material is stacked to embed the intra-substrate component 14 and the mark 12 (an embedding layer forming step).

Figure 9:
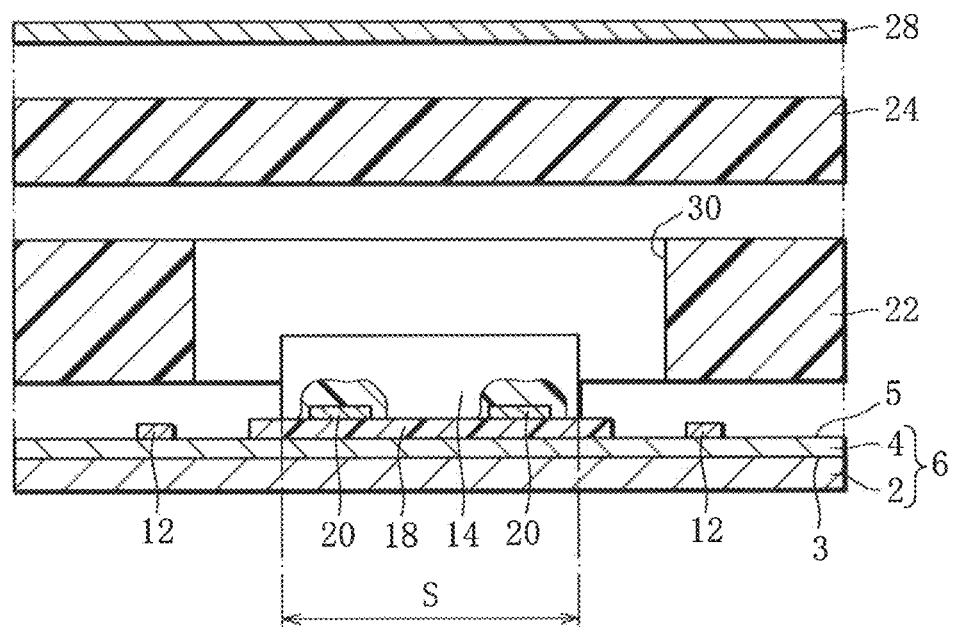
FIG. 9 is a sectional view schematically showing a state in which an insulating base material and a copper foil are stacked on the copper-plated steel plate on which the electronic component is mounted.

First, as shown in FIG. 9, first and second insulating base materials 22 and 24 are prepared. The insulating base materials 22 and 24 are made of resin. The insulating base materials 22 and 24 are so-called prepregs formed in a sheet shape obtained by impregnating thermosetting resin in an unhardened state in glass fiber. The first insulating base material 22 has a through-hole 30. An opening section of the through-hole 30 is formed in size for enabling insertion of the intra-substrate component 14. The height of the through-hole 30 (equivalent to the thickness of the insulating base material 22) is set larger than the height of the intra-substrate component 14. On the other hand, as shown in FIG. 9, the second insulating base material 24 is formed in a flat shape without a through-hole provided therein.

Subsequently, the first insulating base material 22 is stacked on the first copper layer 4. The second insulating base material 24 is superimposed on the upper side of the first insulating base material 22. A copper foil, which should be a second copper layer 28, is further superimposed on the upper side of the second insulating base material 24 to form a stacked body. The first insulating base material 22 is disposed such that the intra-substrate component 14 is located in the through-hole 30. Thereafter, so-called hot press for pressing and heating is applied to the entire stacked body.

Figure 10:
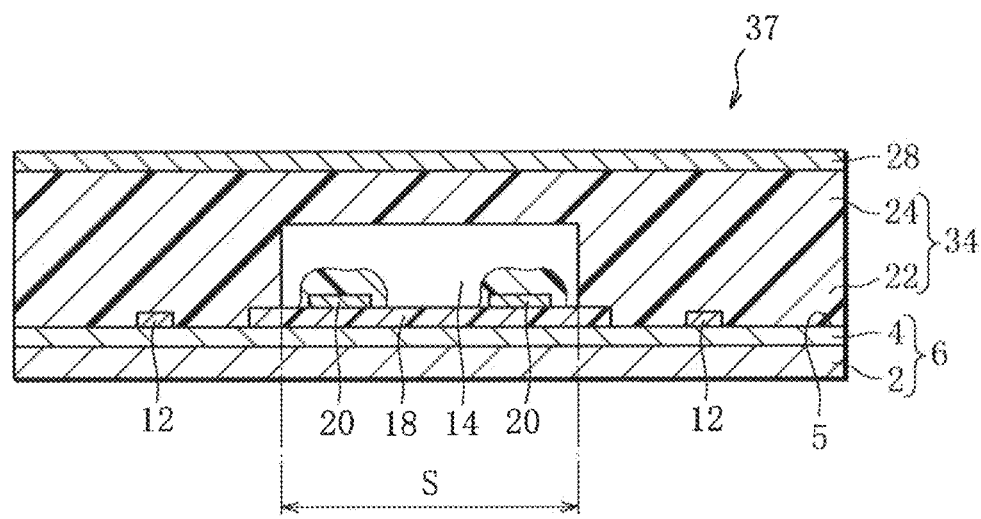
FIG. 10 is a sectional view schematically showing a state in which the insulating base material and the copper foil are stacked and integrated on the copper-plated steel plate on which the electronic component is mounted.

Consequently, after being pressurized and filled in a gap such as the through-hole 30, the thermosetting resin in the unhardened state of the prepregs is hardened by heat of the hot press. As a result, as shown in FIG. 10, an insulating substrate (an embedding layer) 34 consisting of the insulating base materials 22 and 24 is formed. In this way, a pressure-molded body 37 in which the intra-substrate component 14 is embedded in the insulating substrate 34 is obtained. Since the through-hole 30 is provided in the insulating base material 22 in advance, it is possible to avoid pressure applied to the intra-substrate component 14 when the hot press is performed. Therefore, it is possible to embed even the intra-substrate component 14 having large size in the insulating substrate without damaging the intra-substrate component 14.

Figure 11:
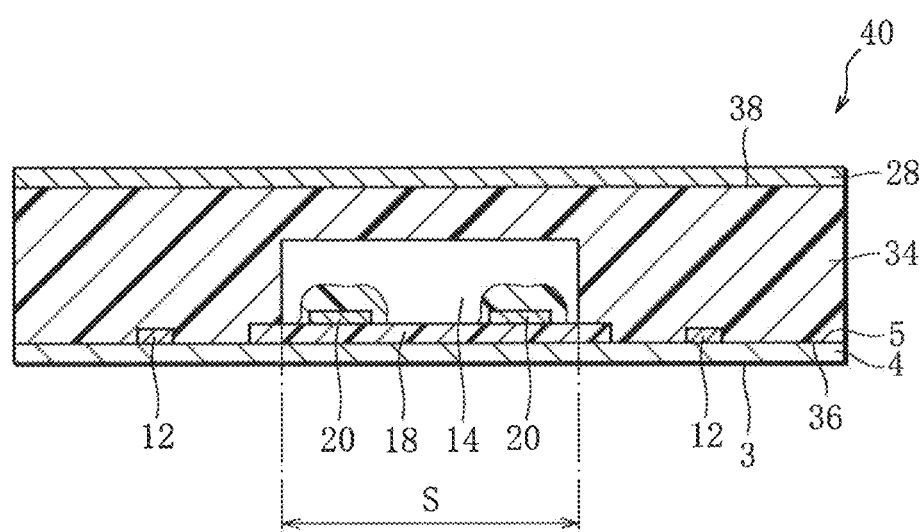
FIG. 11 is a sectional view schematically showing an intermediate product obtained by peeling the supporting plate off the copper layer.

Subsequently, as shown in FIG. 11, the supporting plate 2 is peeled off the pressure-molded body 37. Consequently, an intermediate product 40 of the component incorporated substrate is obtained. The intermediate product 40 includes the insulating substrate 34 including the intra-substrate component 14 on the inside, the first copper layer 4 formed on one surface (a lower surface) 36 of the insulating substrate 34, and the second copper layer 28 formed on the other surface (an upper surface) 38. In the first copper layer 4, the first surface 3 is exposed by the peeling of the supporting plate 2.

Subsequently, a predetermined part of the first copper layer 4 is removed to form a window in the obtained intermediate product 40 (a window forming step).

Figure 12:
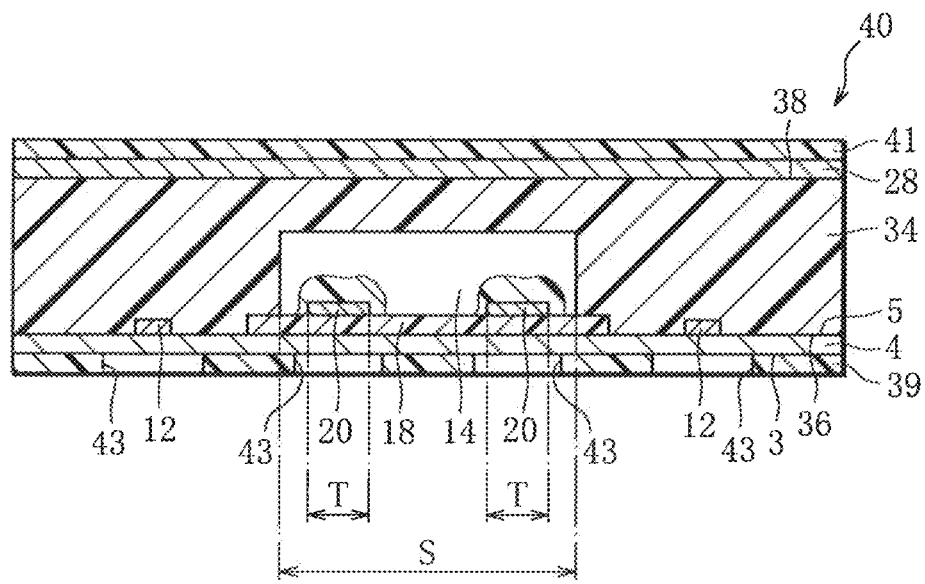
FIG. 12 is a sectional view schematically showing a state in which a mask layer is formed on the copper layer of the intermediate product shown in FIG. 11.

First, as shown in FIG. 12, mask layers 39 and 41 are formed on the surfaces of both the copper layers 4 and 28. The mask layers 39 and 41 are, for example, etching resists consisting of a dry film having predetermined thickness. Openings 43 are provided in predetermined positions. The first surface 3 of the copper layer 4 is exposed from the openings 43. The openings 43 are respectively provided in portions where the marks 12, 12 are present and portions (hereinafter referred to as terminal present sections) T, T where the terminals 20, 20 of the intra-substrate component 14 are present. For example, the portions where the marks 12, 12 are present and the terminal present sections T, T are specified with reference to the end portion of the insulating substrate 34. The openings 43 are formed in size larger than the marks 12, 12 and the terminals 20, 20 in the specified positions. Since the openings 43 are formed larger than the marks 12 and the terminals 20, accuracy in specifying the positions of the openings 43 may be relatively low.

Figure 13:
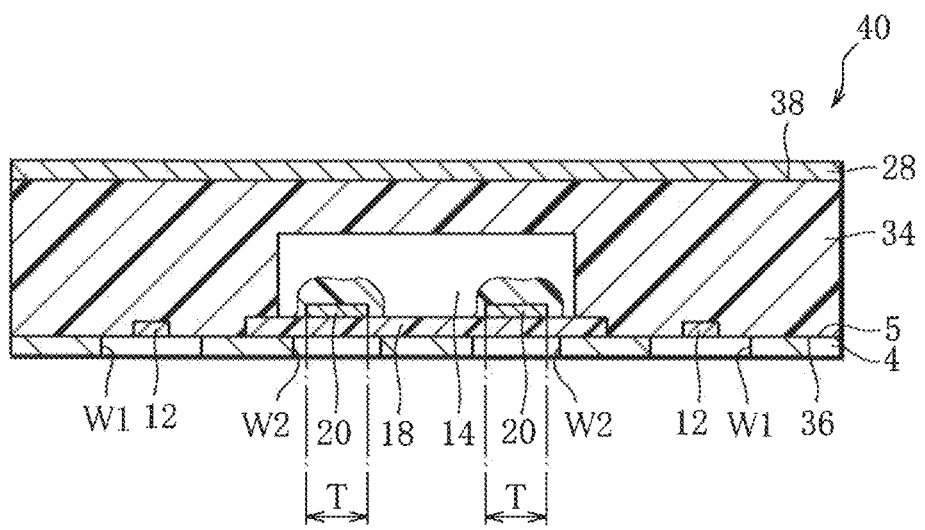
FIG. 13 is a sectional view schematically showing a state in which windows are formed in the intermediate product shown in FIG. 12.

Subsequently, the first copper layer 4 in the exposed portions is removed from the intermediate product 40 by a normal etching method using a copper etching agent consisting of a cupric chloride aqueous solution. Thereafter, the mask layers 39 and 41 are removed. Consequently, as shown in FIG. 13, first windows W1 for partially exposing the insulating substrate 34 together with the marks 12, 12 and second windows W2 for exposing the parts of the adhesive layer 18 including the terminal present sections T are formed. The windows W1 and W2 are modeled after the openings 43 and formed larger than the marks 12, 12 and the terminals 20, 20.

Subsequently, via holes are formed in the adhesive layer 18 of the terminal present sections T (a via hole forming step).

Figure 14:
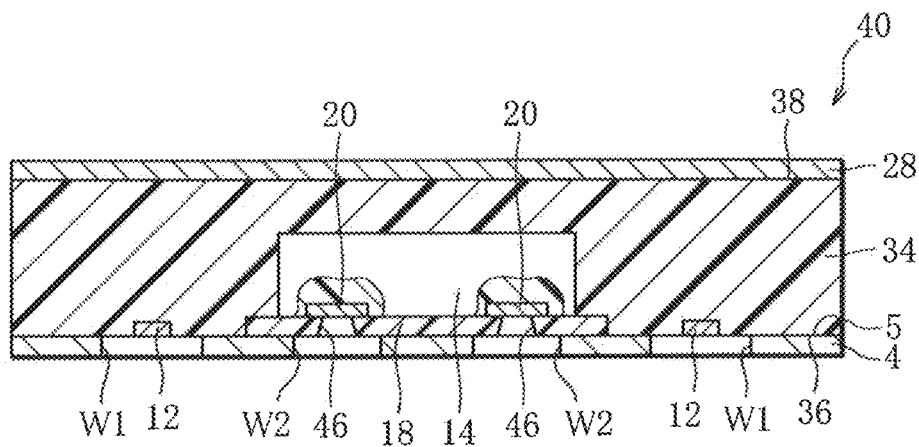
FIG. 14 is a sectional view schematically showing a state in which laser via holes are formed in the intermediate product shown in FIG. 13.

First, the exposed marks 12, 12 are recognized by the optical system sensor of the optical system positioning device (not shown in the figure). The positions of the terminals 20 of the intra-substrate component 14 hidden by the adhesive layer 18 are specified with reference to the positions of the marks 12, 12. Thereafter, a laser, for example, a carbon dioxide laser is irradiated on the adhesive layer 18 in the specified terminal positions to remove the adhesive layer 18. As shown in FIG. 14, laser via holes (hereinafter referred to as LVHs) 46 reaching the terminals 20 are formed. Consequently, the terminals 20 of the intra-substrate component 14 are exposed. The windows W1 and W2 are formed larger than the marks 12, 12 and the terminals 20, 20. Therefore, in the first windows W1, the entire marks 12, 12 can be recognized. In the second windows W2, the laser can be efficiently irradiated on target parts without being reflected by the copper layer 4.

As it is evident from the forms explained above, the present invention is characterized in that the marks 12, 12 used for the positioning of the intra-substrate component 14 are used for the formation of the LVHs 46 again. That is, in the present invention, since the marks common to the positioning of the intra-substrate component 14 and the positioning of the LVHs 46 are used, it is possible to exhibit extremely high positioning accuracy. It is possible to form the LVHs 46 in accurate positions with respect to the terminals 20 hidden by the adhesive layer 18.

Subsequently, after a resin residue is removed from the intermediate product 40, in which the LVHs 46 are formed, by desmear treatment, plating treatment is applied to the intermediate product 40 to deposit copper on the surface of the intermediate product 40. The copper is filled in the LVHs 46. Consequently, conduction vias that electrically connect the terminals 20 of the intra-substrate component 14 and the first copper layer 4 are formed (a conduction via forming step).

Figure 15:
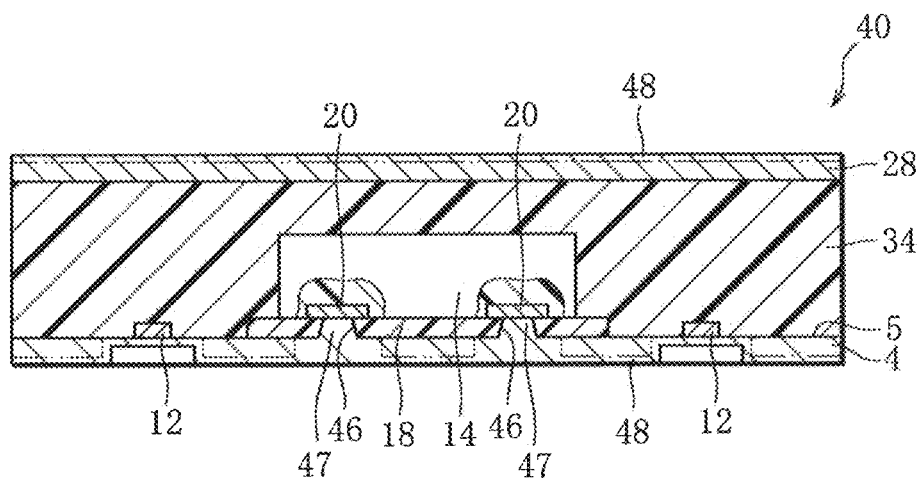
FIG. 15 is a sectional view schematically showing a state in which plating treatment is applied to the intermediate product shown in FIG. 14.

First, electroless plating treatment of copper is applied to the insides of the LVHs 46 to cover the inner wall surfaces of the LVHs 46 and the surfaces of the terminals 20 of the intra-substrate component 14. Thereafter, electroplating treatment of copper is applied to grow, as shown in FIG. 15, a plated layer 48 of copper that covers the entire first copper layer 4 and the entire second copper layer 28 including the LVHs 46. Consequently, the LVHs 46 are filled with copper and conduction vias 47 are formed. The conduction vias 47 are integrated with the first copper layer 4. The terminals 20 of the intra-substrate component 14 and the first copper layer 4 are electrically connected.

Subsequently, a part of the first copper layer 4 and the second copper layer 28 on the surface of the insulating substrate 34 is removed to form predetermined wiring patterns 50 (a pattern forming step).

Figure 16:
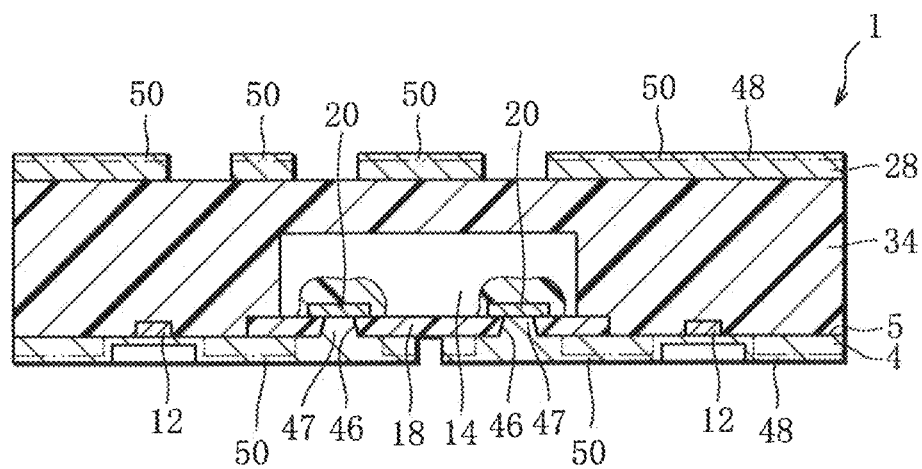
FIG. 16 is a sectional view showing a state in which wiring patterns are formed on the intermediate product shown in FIG. 15.

For the removal of a part of both the copper layers 4 and 28, the normal etching method is used. Consequently, as shown in FIG. 16, the predetermined wiring patterns 50 are formed on the surface of the insulating substrate 34.

Figure 17:
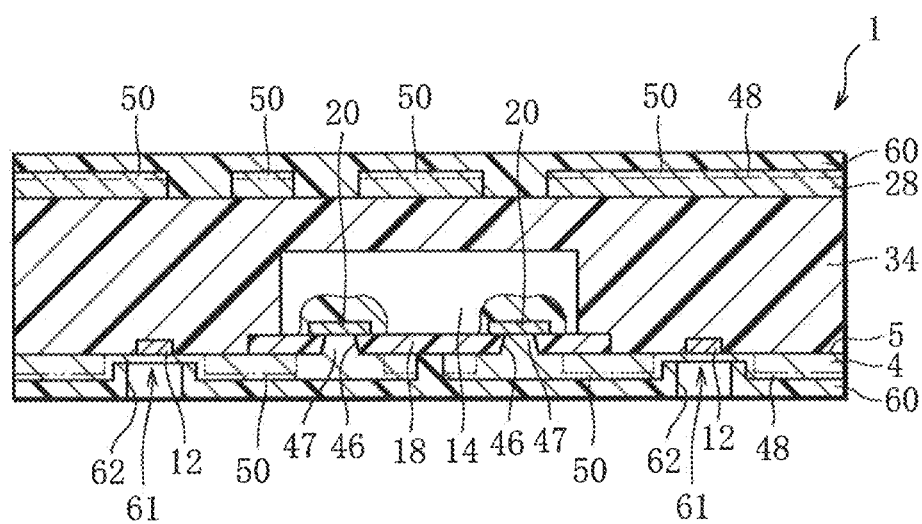
FIG. 17 is a sectional view schematically showing a component incorporated substrate according to an embodiment of the present invention.

After the wiring patterns 50 are formed, a solder resist is applied to a portion where adhesion of solder is desired to be avoided on the surface of the insulating substrate 34. Consequently, a solder resist layer 60 is formed on the surface of the insulating substrate 34. In this embodiment, as shown in FIG. 17, the solder resist is not applied to the portions of the marks 12. Openings 62 are provided in the solder resist layer 60. As a result, the portions of the plated layer 48 of copper corresponding to the portions of the marks 12 are exposed and change to lands for component mounting 61.

As explained above, a component incorporated substrate 1 is obtained in which, in the insulating substrate 34 including the predetermined wiring patterns 50 on the surface, the intra-substrate component 14 including the terminals 20 electrically connected to the wiring patterns 50 is incorporated.

The component incorporated substrate 1 obtained in this way can be formed as a module substrate by surface-mounting other electronic components on the surface. The component incorporated substrate 1 can also be used as a core substrate to form a multilayer circuit substrate using a normally-performed build-up method.

Note that, in the first embodiment, the second windows are formed together with the first windows in the window forming step. However, the present invention is not limited to such a form. A form for forming only the first windows may be adopted. In this case, the positions of the terminals 20 of the component 14 are specified with reference to the marks 12 exposed from the first windows. The adhesive layer 18 including the copper layer 4 is removed to form via holes using, for example, a copper direct method.

Next, second to fifth embodiments are explained. In explaining the embodiments, concerning steps same as the steps already explained, detailed explanation of the steps is omitted. Constituent members and parts that exhibit functions same as the functions of the constituent members and the parts explained above are denoted by the same reference numerals and signs and explanation of the constituent members and the parts is omitted.

Second Embodiment

Figure 18:
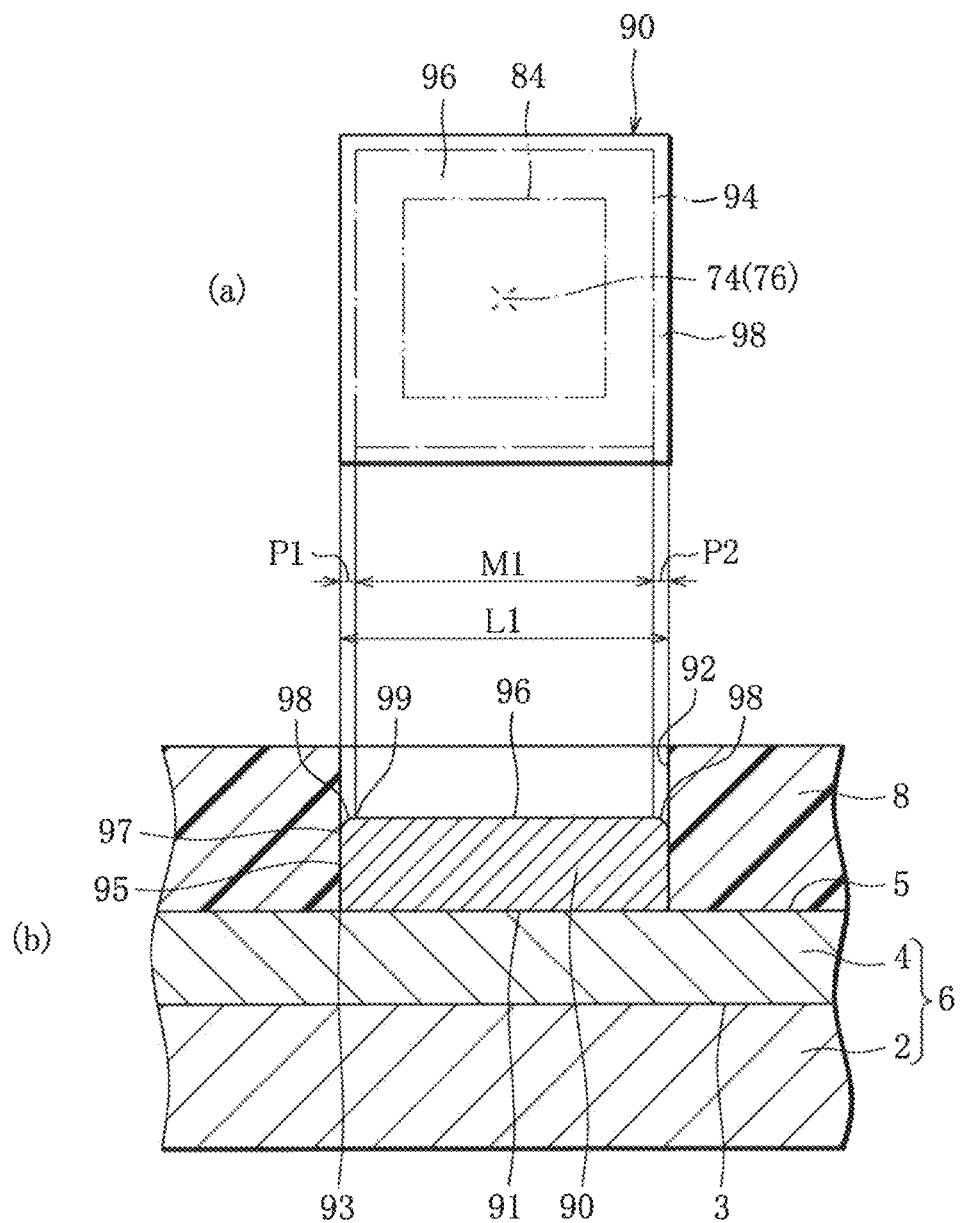
FIG. 18 is a plan view (a) and a sectional view (b) showing a mark used in a second embodiment of the present invention.

A second embodiment is different from the first embodiment only in that a mark 90, a plan view shape of which is square, shown in FIG. 18 is formed in the mark forming step in the first embodiment.

In the mark forming step in the second embodiment, first, as shown in FIG. 18(b), the mask layer 8 is formed on the first copper layer 4 of the prepared copper-plated steel plate 6. In the mask layer 8, an opening 92 consisting of a through-hole, a plan view shape of which is square, is provided in a predetermined position. Electroplating of copper is applied to the copper-plated steel plate 6 including such a mask layer 8 to form a copper plated layer in the opening 92. Consequently, as shown in FIG. 18(a), the mark 90, the plan view shape of which is square, is obtained. As it is evident from FIG. 18, an outer ridgeline 94 of the mark 90 is formed in a square shape and is located further on the outer side than the lower limit region 84.

In this embodiment, an optical system sensor, the length of one side of the search range 78 of which is 3 mm, is used. Specific dimensions of sections in this embodiment are as described below. Width L1 of the mark 90 is 1.541 mm, width M1 of a top surface 96 is 1.462 mm, and widths P1 and P2 of an outer circumferential curved surface 98 are respectively 0.042 mm and 0.037 mm. Note that, in FIG. 18, reference numeral 91 represents the proximal end face of the mark 90, reference numeral 93 represents the outer circumferential edge of the proximal end face 91 of the mark 90, reference numeral 95 represents the side surface of the mark 90, reference numeral 97 represents the distal end edge of the side surface 95, and reference numeral 99 represents the distal end edge of the outer circumferential curved surface 98.

Third Embodiment

Figure 19:
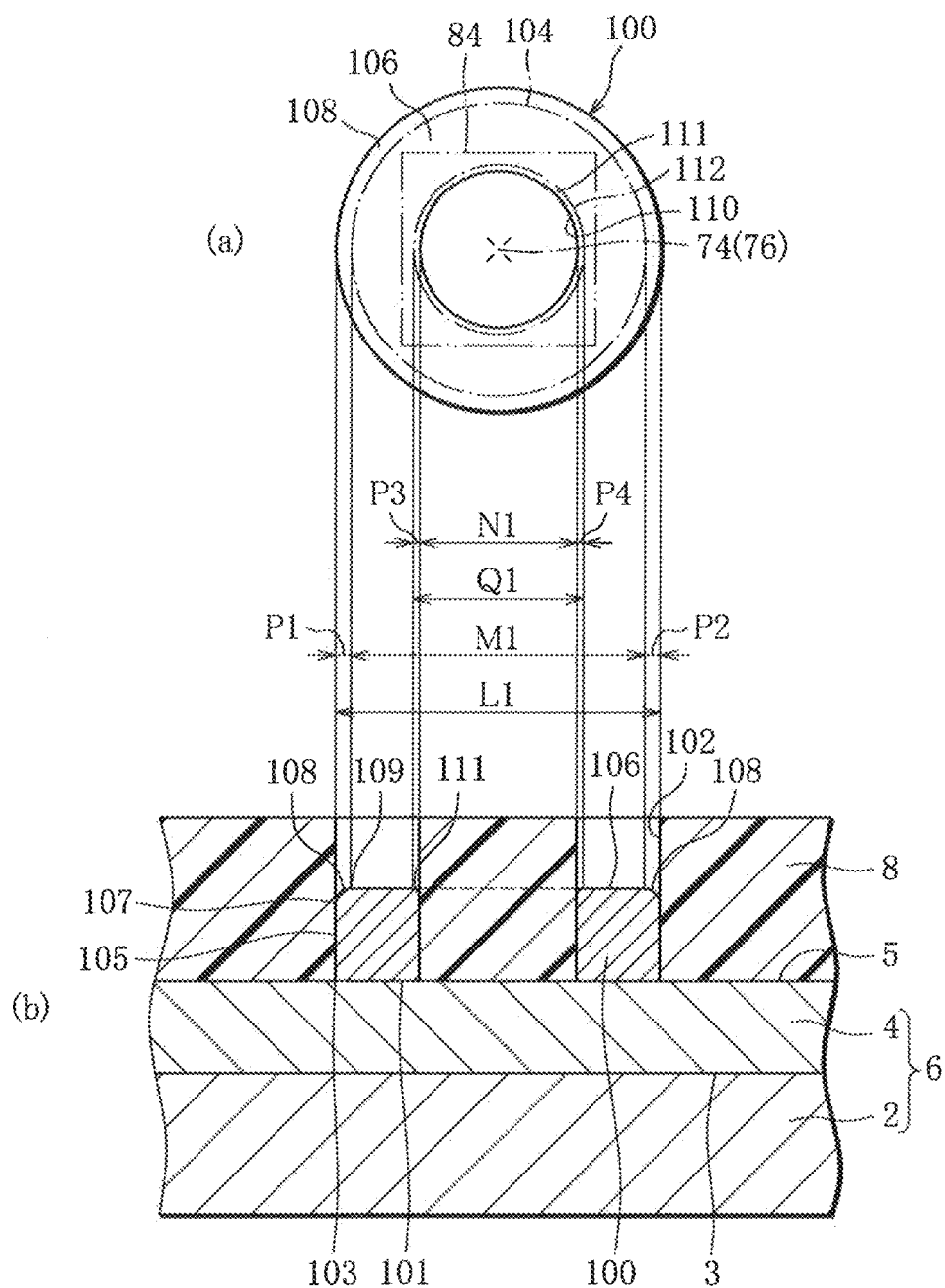
FIG. 19 is a plan view (a) and a sectional view (e) showing a mark used in a third embodiment of the present invention.

A third embodiment is different from the first embodiment only in that a ring-like mark 100, a plan view shape of which is circular, shown in FIG. 19 is formed in the mark forming step in the first embodiment.

In the mark forming step in the third embodiment, first, as shown in FIG. 19(b), the mask layer 8 is formed on the first copper layer 4 of the prepared copper-plated steel plate 6. In the mask layer 8, an opening 102 consisting of a ring-like through-hole, a plan view shape of which is circular, is provided in a predetermined position. Electroplating of copper is applied to the copper-plated steel plate 6 including such a mask layer 8 to form a copper plated layer in the opening 102. Consequently, as shown in FIG. 19(a), the ring-like mark 100, the plan view shape of which is circular, is obtained. As it is evident from FIG. 19, an outer ridgeline 104 of the mark 100 is formed in a circular shape and is located further on the outer side than the lower limit region 84. In the mark 100, a circular center through-hole 110 is present in the center. An inner circumferential curved surface 111 and an inner shape ridgeline 112 are formed at the upper end edge portion of the center through-hole 110.

In this embodiment, an optical system sensor, the length of one side of the search range 78 of which is 5 mm, is used. Specific dimensions of sections in this embodiment are as described below. Width (a diameter) L1 of the mark 100 is 2.508 mm, width (a diameter) M1 of a top surface 106 is 2.431 mm, width (a diameter) N1 of the center through-hole 110 is 1.300 mm, width (a diameter) Q1 of the inner shape ridgeline 112 is 1.401 mm, widths P1 and P2 of an outer circumferential curved surface 108 are respectively 0.042 mm and 0.035 mm, widths P3 and P4 of the inner circumferential curved surface 111 are respectively 0.046 mm and 0.055 mm.

Note that, in FIG. 19, reference numeral 101 represents the proximal end face of the mark 100, reference numeral 103 represents the outer circumferential edge of the proximal end face 101 of the mark 100, reference numeral 105 represents the side surface of the mark 100, reference numeral 107 represents the distal end edge of the side surface 105, and reference numeral 109 represents the distal end edge of the outer circumferential curved surface 108.

Fourth Embodiment

Figure 20:
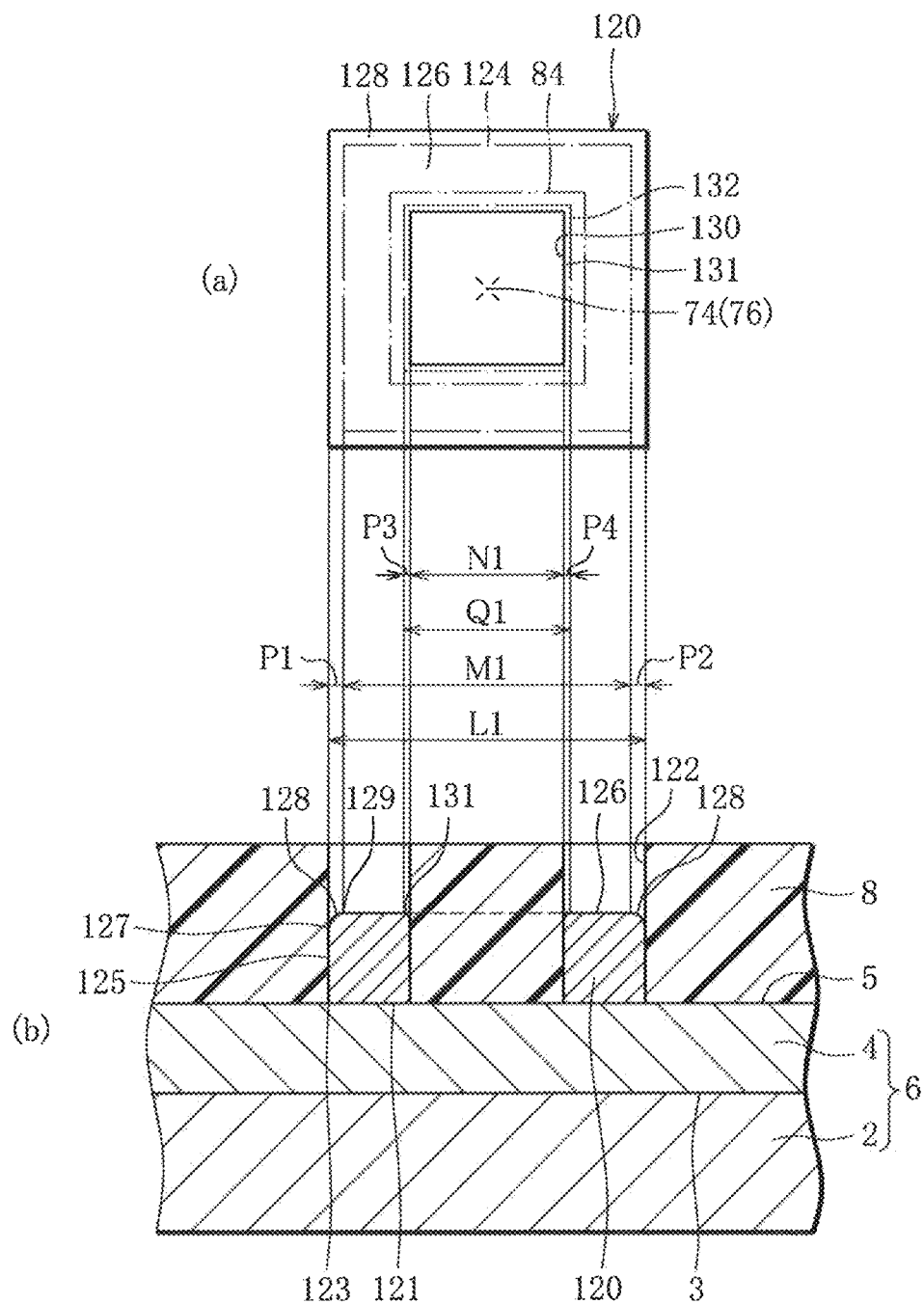
FIG. 20 is a plan view (a) and a sectional view (b) showing a mark used in a fourth embodiment of the present invention.

A fourth embodiment is different from the first embodiment only in that a ring-like mark 120, a plan view shape of which is square and the center of which is hollowed in a rectangular shape, shown in FIG. 20 is formed in the mark forming step in the first embodiment.

In the mark forming step in the fourth embodiment, first, as shown in FIG. 20(b), the mask layer 8 is formed on the first copper layer 4 of the prepared copper-plated steel plate 6. In the mask layer 8, an opening 122 consisting of a ring-like through-hole, a plan view shape of which is square, is provided in a predetermined position. Electroplating of copper is applied to the copper-plated steel plate 6 including such a mask layer 8 to form a copper plated layer in the opening 122. Consequently, as shown in FIG. 20(a), the ring-like mark 120, the plan view shape of which is square and the center of which is hollowed in a rectangular shape, is obtained. As it is evident from FIG. 20, an outer ridgeline 124 of the mark 120 is formed in a square shape and is located further on the outer side than the lower limit region 84. In the mark 120, a square center through-hole 130 is present in the center. An inner circumferential curved surface 131 and an inner shape ridgeline 132 are formed at the upper end edge portion of the center through-hole 130.

In this embodiment, an optical system sensor, the length of one side of the search range 78 of which is 5 mm, is used. Specific dimensions of sections in this embodiment are as described below. Width L1 of the mark 120 is 2.559 mm, width M1 of a top surface 126 is 2.472 mm, width N1 of the center through-hole 130 is 0.500 mm, width Q1 of the inner shape ridgeline 132 is 0.577 mm, widths P1 and P2 of an outer circumferential curved surface 128 are respectively 0.048 mm and 0.039 mm, widths P3 and P4 of the inner circumferential curved surface 131 are respectively 0.036 mm and 0.041 mm.

Note that, in FIG. 20, reference numeral 121 represents the proximal end face of the mark 120, reference numeral 123 represents the outer circumferential edge of the proximal end face 121 of the mark 120, reference numeral 125 represents the side surface of the mark 120, reference numeral 127 represents the distal end edge of the side surface 125, and reference numeral 129 represents the distal end edge of the outer circumferential curved surface 128.

Fifth Embodiment

Figure 21:
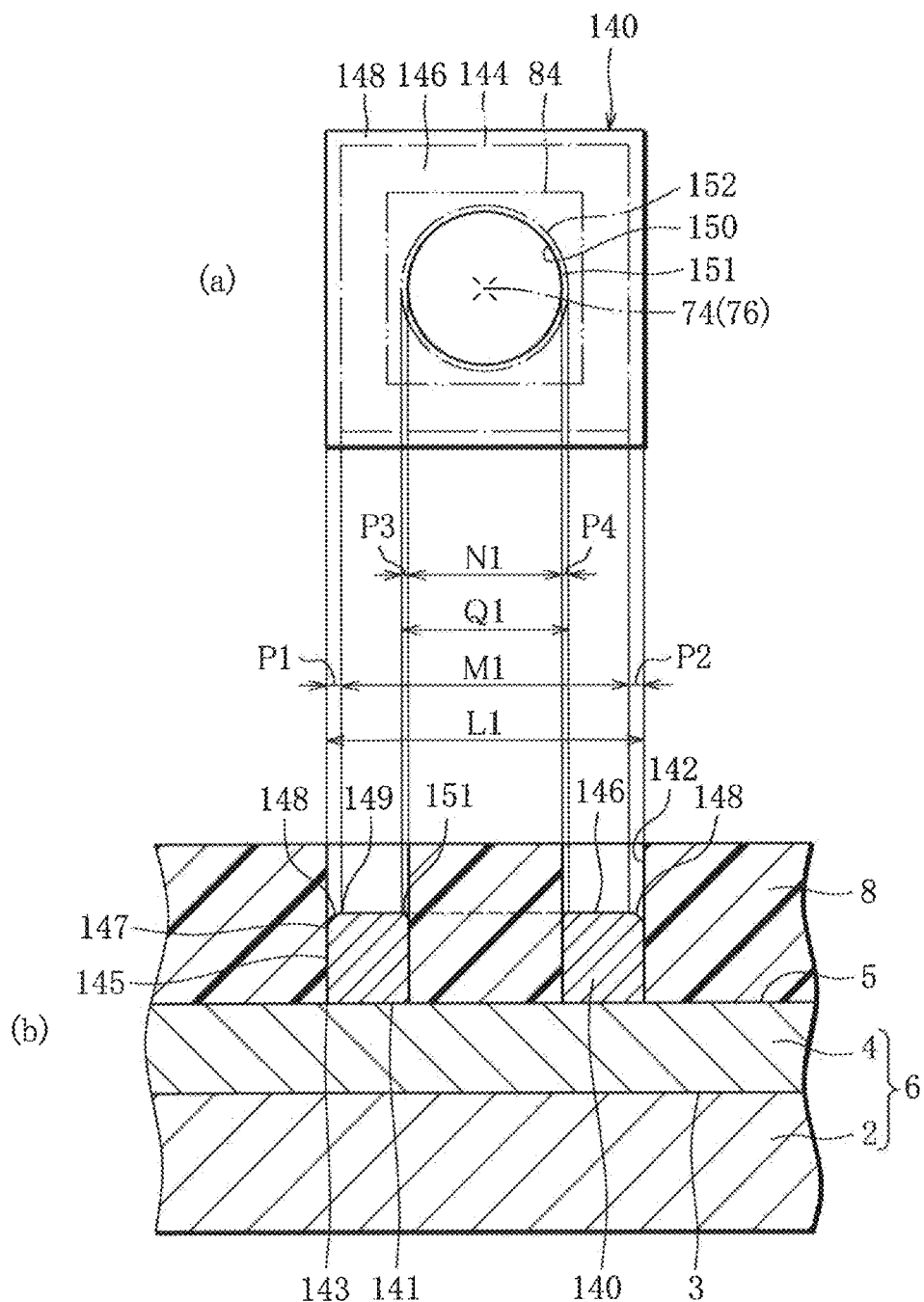
FIG. 21 is a plan view (a) and a sectional view (b) showing a mark used in a fifth embodiment of the present invention.

A fifth embodiment is different from the first embodiment only in that a ring-like mark 140, a plan view shape of which is square and the center of which is hollowed in a circular shape, shown in FIG. 21 is formed in the mark forming step in the first embodiment.

In the mark forming step in the fifth embodiment, first, as shown in FIG. 21(b), the mask layer 8 is formed on the first copper layer 4 of the prepared copper-plated steel plate 6. In the mask layer 8, an opening 142 is provided in a predetermined position. The opening 142 consists of a through-hole formed in a ring shape as a whole in which a part of the mask layer 8 having a columnar shape is located in the center of a through-hole, a plan view shape of which is formed in a square shape. Electroplating of copper is applied to the copper-plated steel plate 6 including such a mask layer 8 to form a copper plated layer in the opening 142. Consequently, as shown in FIG. 21(a), the ring-like mark 140, the plan view shape of which is square and the center of which is hollowed in a circular shape, is obtained. As it is evident from FIG. 21, an outer ridgeline 144 of the mark 140 is formed in a square shape and is located further on the outer side than the lower limit region 84. In the mark 140, a circular center through-hole 150 is present in the center. An inner circumferential curved surface 151 and an inner shape ridgeline 152 are formed at the upper end edge portion of the center through-hole 150.

In this embodiment, an optical system sensor, the length of one side of the search range 78 of which is 5 mm, is used. Specific dimensions of sections in this embodiment are as described below. Width L1 of the mark 140 is 2.577 mm, width M1 of a top surface 146 is 2.475 mm, width N1 of the center through-hole 150 is 0.300 mm, width Q1 of the inner shape ridgeline 152 is 0.408 mm, widths P1 and P2 of an outer circumferential curved surface 148 are respectively 0.057 mm and 0.045 mm, widths P3 and P4 of the inner circumferential curved surface 151 are respectively 0.048 mm and 0.060 mm.

Note that, in FIG. 21, reference numeral 141 represents the proximal end face of the mark 140, reference numeral 143 represents the outer circumferential edge of the proximal end face 141 of the mark 140, reference numeral 145 represents the side surface of the mark 140, reference numeral 147 represents the distal end edge of the side surface 145, and reference numeral 149 represents the distal end edge of the outer circumferential curved surface 148.

As explained above, the marks 12, 90, 100, 120, and 140 in the first to fifth embodiments are formed in the shapes in which all of the outer ridgelines 25, 94, 104, 124, and 144 are located further on the outer side than the lower limit region 84. Consequently, since a relation in which the length of the mark reference line 82 is in a range of 30% or more of the total length of the search reference line 80 is satisfied, it is possible to reduce a reading error of an outer ridgeline and attain improvement of detection accuracy of a mark.

Note that, in the present invention, the component incorporated in the insulating substrate is not limited to the package component. Other various electronic components such as a chip component can be components incorporated in the insulating substrate.

The material forming the mark is not limited to copper. Other materials such as nickel can also be used. When the mark is hollowed as in the third to fifth embodiments, it is possible to reduce an amount of the plating material for the mark. Therefore, this is effective in forming the mark using an expensive material.

EXPLANATION OF REFERENCE SIGNS

1 Component incorporated substrate
2 Supporting plate
3 First surface
4 First copper layer
5 Second surface
6 Copper-plated steel plate
8 Mask layer
12 Marks
14 Electronic component (intra-substrate component)
16 Adhesive
18 Adhesive layer
20 Terminals
25 Outer ridgeline
34 Insulating substrate
40 Intermediate product
46 Laser via holes (LVHs)
47 Conduction vias
50 Wiring patterns
80 Search reference line
82 Mark reference line
84 Lower limit region
S Mounting planned region
T Terminal present sections

The invention claimed is:

1. A manufacturing method for a component incorporated substrate in which, in an insulating substrate including a wiring pattern on a surface, an electric or electronic component including a terminal electrically connected to the wiring pattern is incorporated, the manufacturing method comprising:
  a mark forming step for forming a copper layer to be patterned as the wiring layer on a supporting plate and forming a mark formed by a plating method on a second surface on an opposite side of a first surface in contact with the supporting plate of the copper layer, the mark having a proximal end face in contact with the second surface, a side surface extending from an outer circumferential edge of the proximal end face in a direction orthogonal to the second surface, an outer circumferential curved surface tapering and extending in an arcuate shape from a proximal end edge of the side surface, and a top surface extending from a distal end edge of the outer circumferential curved surface and opposed to the proximal end face;
  a component mounting step for, after detecting the mark using detecting means for detecting a detection target in a square search range set in an image pickup screen that reflects a picked-up image of the detection target, positioning the component with reference to the detected mark and mounting the component on the second surface of the copper layer with an insulative adhesive layer interposed therebetween;
  an embedding layer forming step for forming, on the second surface of the copper layer on which the component is mounted, an embedding layer functioning as the insulating substrate in which the component and the mark are embedded;
  a window forming step for, after peeling the supporting plate off the copper layer, etching and removing, with a copper etching agent used for etching of copper, a part of the copper layer from the first layer side of the copper layer exposed by the peeling and forming a window for partially exposing the embedding layer together with the entire proximal end face of the mark;
  a conduction via forming step for specifying a position of the terminal of the component with reference to the mark exposed from the window and, after forming a via hole reaching the terminal, filling a conductive material in the via hole and forming a conduction via for electrically connecting the terminal and the copper layer; and
  a pattern forming step for forming the copper layer electrically connected to the terminal via the conduction via into the wiring pattern, wherein
  in the mark forming step, when an imaginary line extending from a search center, which is a center of the search range, to an edge side of the search range is represented as a search reference line and an imaginary line extending, in a state in which a center of the mark is matched with the search center, from the center of the mark in a same direction as the search reference line and to an outer ridgeline, which is a boundary between the top surface and the outer circumferential curved surface in the mark, is represented as a mark reference line, the mark is formed in a shape in which the outer ridgeline of the mark is present in a position where a length of the mark reference line is in a range of 30% or more of the search reference line.

2. The manufacturing method for the component incorporated substrate according to claim 1, wherein the mark is formed in a circular shape in plan view.

3. The manufacturing method for the component incorporated substrate according to claim 1, wherein the mark is formed in a square shape in plan view.

4. The manufacturing method for the component incorporated substrate according to claim 1, wherein the mark is formed in a ring shape in plan view.

* * * * *